United States Patent
Varela et al.

(10) Patent No.: US 8,148,239 B2
(45) Date of Patent: Apr. 3, 2012

(54) OFFSET FIELD GRID FOR EFFICIENT WAFER LAYOUT

(75) Inventors: Alejandro Varela, Phoenix, AZ (US); Troy L. Harling, Gresham, OR (US); Daniel E. Vanlare, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/646,459

(22) Filed: Dec. 23, 2009

(65) Prior Publication Data

US 2011/0147897 A1    Jun. 23, 2011

(51) Int. Cl.
  *H01L 21/00*  (2006.01)
  *H01L 23/58*  (2006.01)
(52) U.S. Cl. .......... 438/462; 438/464; 257/798
(58) Field of Classification Search .......... None
   See application file for complete search history.

(56) References Cited

U.S. PATENT DOCUMENTS

| | | | | |
|---|---|---|---|---|
| 3,169,837 | A * | 2/1965 | Moross et al. | 428/580 |
| 5,128,737 | A * | 7/1992 | van der Have | 257/503 |
| 5,208,469 | A * | 5/1993 | Hodoshima | 257/208 |
| 5,217,916 | A * | 6/1993 | Anderson et al. | 438/128 |
| 5,340,772 | A * | 8/1994 | Rosotker | 438/460 |
| 5,912,502 | A * | 6/1999 | Kano | 257/620 |
| 6,303,899 | B1 * | 10/2001 | Johnson et al. | 219/121.69 |
| 6,420,245 | B1 * | 7/2002 | Manor | 438/460 |
| 6,521,513 | B1 * | 2/2003 | Lebens et al. | 438/462 |
| 6,528,864 | B1 | 3/2003 | Arai | |
| 6,777,313 | B2 * | 8/2004 | Takyu et al. | 438/464 |
| 7,488,668 | B2 | 2/2009 | Arita et al. | |
| 2004/0097012 | A1 * | 5/2004 | Weber et al. | 438/113 |

FOREIGN PATENT DOCUMENTS

| | | |
|---|---|---|
| JP | 59220947 A | 12/1984 |
| WO | 2011/087572 A2 | 7/2011 |

OTHER PUBLICATIONS

Dr. Mike Cooke, Scribe and dice, The Advanced Semiconductor Magazine, Technical Feature, Back-end process, May 2006, pp. 20-24, vol. 19, No. 4.
International Search Report and Written Opninion received for PCT Patent Application No. PCT/US2010/057381, mailed Jul. 13, 2011, 9 pages.
Chien, et al., "A Cutting Algorithm for Optimizing the Wafer Exposure", IEEE Transactions on Semiconductor Manufacturing, May 2001,vol. 14, No. 2, pp. 157-162.

\* cited by examiner

*Primary Examiner* — Scott B Geyer
(74) *Attorney, Agent, or Firm* — Winkle, PLLC

(57) ABSTRACT

Techniques are provided for efficient wafer layout, which include the use of an offset grid to optimize use of available wafer space. As such, the number of identical die that can be fabricated on the wafer can be increased, relative to a standard perpendicular grid. By adding additional registration marks, an increase in flexibility of where each row/column of fields can be printed is enabled. This increased level of freedom in-turn allows for the optimization of the number of die that each row/column can contain, and translates directly into an increase in the number of yielding die per wafer. In addition, techniques are provided that allow for the dicing of individual die in a non-Cartesian coordinated manner. However, conventional singulation techniques can be used as well, given attention to the offset grid lines.

21 Claims, 10 Drawing Sheets

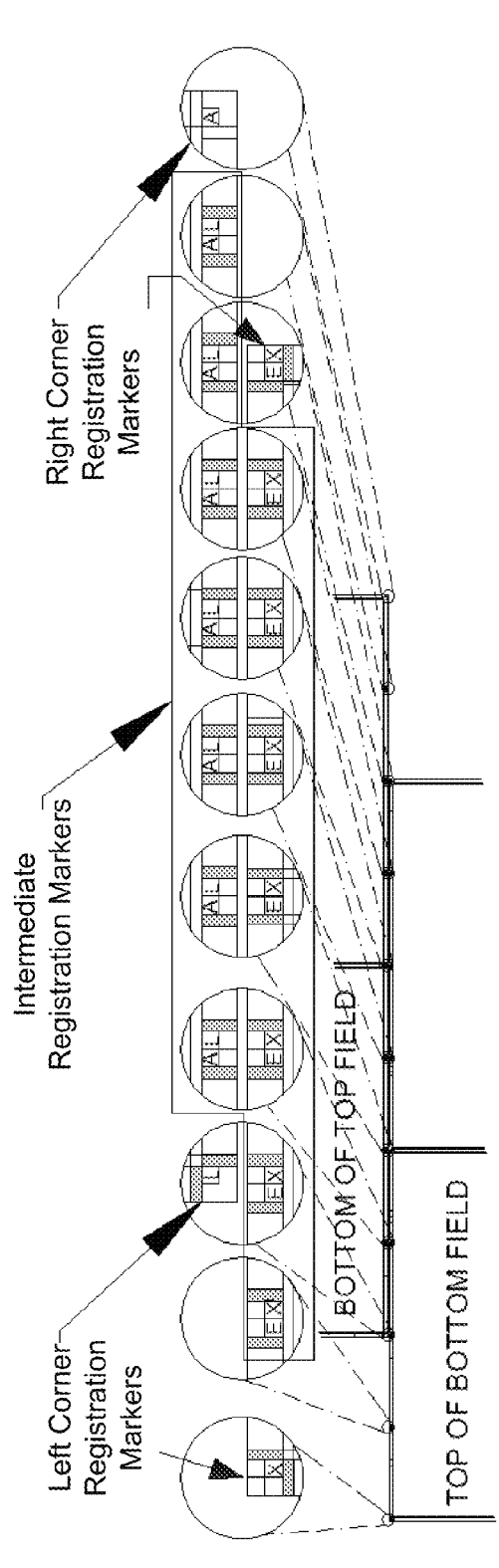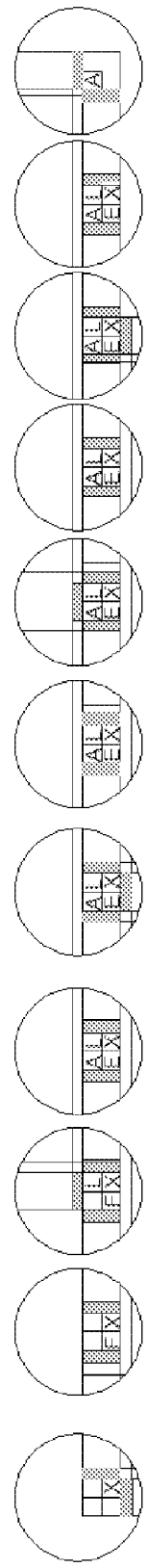
Fig. 4a
Fig. 4b

OFFSET FIELD GRID FOR EFFICIENT WAFER LAYOUT

BACKGROUND

Semiconductor wafers, such as silicon, germanium, and III-V material wafers, are used in the fabrication of integrated circuits, where the wafer effectively acts as a substrate upon which microelectronic devices can be formed using various semiconductor processes such as photolithography (e.g., patterning, etching, depositing, etc), epitaxy, doping, polishing, and other such known processes. Typically, a number of identical electronic devices are formed on a single wafer, ranging from tens to hundreds to even thousands of devices per wafer, depending on the size of the device die.

Once formed on the wafer, the devices can be electrically tested and then sorted into passing and non-passing die, using various wafer probing techniques. The wafer can then be singulated into individual die. The singulation process can be carried out using known techniques such as scribing and breaking, dicing or wire saws, or laser cutting. A perpendicular Cartesian grid is used for delineating the individual die, so that during the singulation process the die can be cut in a linear manner across this standard grid. Following the singulation process, the individual die can then be encapsulated into suitable chip packaging, to provide discrete integrated circuits.

BRIEF DESCRIPTION OF THE DRAWINGS

FIGS. 4a and 4b illustrate example neighboring top and bottom fields that are offset from one another but aligned using multiple registration marks, in accordance with an embodiment of the present invention.

DETAILED DESCRIPTION

Figure 1B:
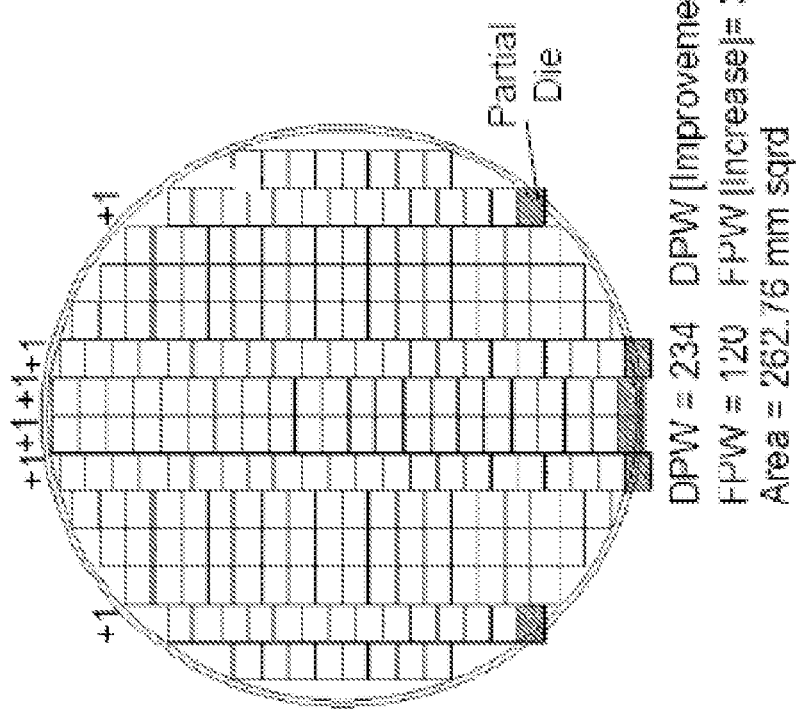
FIG. 1b illustrates a wafer configured with non-Cartesian grid of rows and columns of fields, in accordance with an embodiment of the present invention.

Techniques are provided for efficient wafer layout, which include the use of an offset grid to optimize use of available wafer space. As such, the number of identical die that can be fabricated on the wafer is increased, relative to a standard perpendicular grid. Depending on the wafer size and die footprint, the increase can be in the range of 1% to 5%, which is significant when projected over thousands of wafers.

General Overview

As previously explained, identical integrated circuit dies fabricated on a wafer are normally singulated in a linear manner across a standard perpendicular grid. Thousands of wafers can be fabricated in the same manner, to produce hundreds of thousands of individual die. However, when each wafer is printed, a significant portion of each wafer is wasted along the outer diameter edge, because the industry standard Cartesian layout is limited by a tradeoff of field sizing and wafer dicing needs preventing use of the given region. Partial and sometimes even full die may be printed in this area in order to sustain uniform manufacturing operations, but the full die within this edge exclusion zone normally do not yield and the partial die are discarded as unusable during the dicing operation. Sometimes this edge zone is merely left as empty silicon which is discarded after dicing. Although the amount of wasted wafer is relatively small for a single wafer or non-commercial operations, the waste becomes significant during full-scale commercial production.

Thus, and in accordance with an embodiment of the present invention, an offset lithography field layout is provided that increases the number of die that can fit on a single wafer by approximately 1 to 2% conservatively, or more. By adding additional registration marks to, for example, the field scribe locations, an increase in flexibility of where each row of fields can be printed is enabled. This increased level of freedom in-turn allows for the optimization of the number of die that each row can contain, and translates directly into an increase in the number of yielding die per wafer. In addition, techniques are provided that allow for the dicing of individual die in a non-Cartesian coordinated manner. However, conventional singulation techniques can be used as well, given attention to the offset grid lines.

The techniques can be embodied, for example, in semiconductor processing equipment configured for executing lithography field layout and subsequent printing (device formation) within those fields. The actual type of devices being formed on the wafer is not particularly relevant, other than that they are identical. The devices being formed may be, for example, processors, memory devices, transistors, or logic circuits. Numerous other microelectronic devices that can be formed on a wafer will be apparent, whether the device is a discrete component or a circuit including many components. The disclosed methodologies are suitable for practice at fabs where microelectronics are made on a large scale production basis, or even in smaller scale production environments (e.g., custom built silicon). In short, the offset grid techniques provided herein can be used to optimize or otherwise improve wafer usage in any production environment.

The increased yield results, for instance, because the individual die are more balanced across the surface of each wafer given that the field rows can be centered (via an offset grid as described herein) optimizing yieldable output. In addition, the field alignment process may be achieved more quickly. In particular, when a typical lithography tool prints die on a wafer, the tool pre-aligns each field in position, which can be accomplished using machine vision to locate the registration marks of the target wafer. Because a conventional field grid is not offset, some of the registration marks fall outside of the wafer, which complicates the alignment process by requiring additional processing. With an offset grid as described herein, however, more fields can be printed inside the wafer, and therefore fewer registration marks outside of the wafer are likely. As such, the alignment process may be faster. Note that even a 1% improvement in tool speed may translate to long term savings in the millions of dollars, depending on the number of tools employed and throughput.

Thus, current solutions for lithography field layout do not optimally utilize the available wafer surface during die production, thereby leaving wasted space resulting from the need to fit square or rectangular die into a perpendicular or Cartesian grid across the top surface of a round substrate. This results in wasted area along the edges of the substrate. The techniques provided herein can be used to optimize individual field row (or column) placement thereby maximizing the yielding die achieved on each wafer. This yield increase may be, for example, approximately 1.5% more die in every wafer (or more, depending on particulars of the device being formed), and can be accomplished with no or minimal change to the factory processing operations and for virtually the same cost.

Offset Lithography Field Layout

Figure 1A:
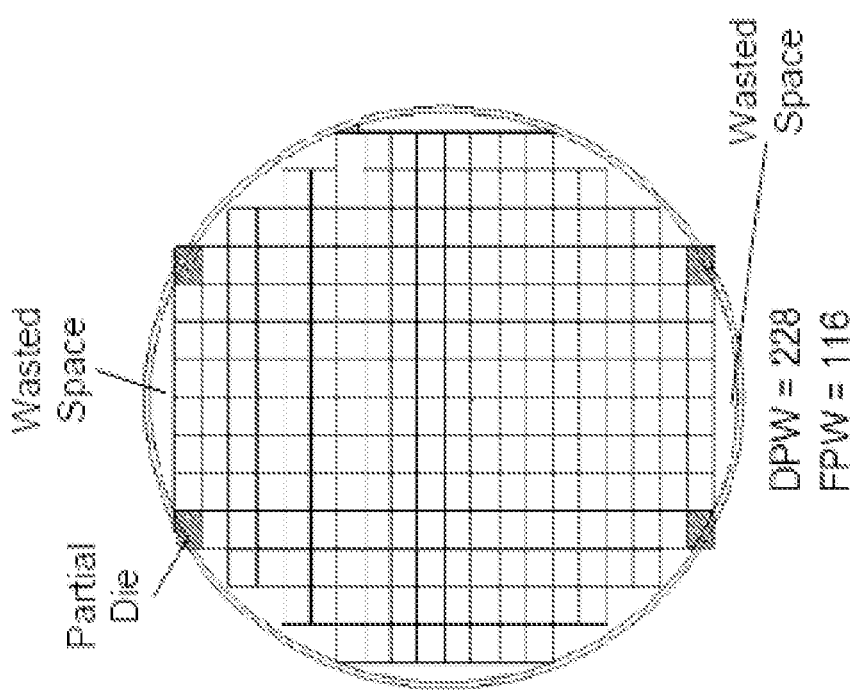
FIG. 1a illustrates the wasted space on a printed wafer due to the need to align each field in a linear Cartesian system.

FIG. 1a illustrates the wasted space on a printed wafer due to the need to align each field in a linear Cartesian system. As known, a Cartesian grid includes multiple columns and rows of equally sized squares, with no offset from one row or column to the next row or column (as best illustrated in FIG. 1a). In this example case, the desired field is 1 die wide by 2 die tall. The resulting layout provides 116 fields per wafer (FPW), and 228 die per wafer (DPW). Note the wasted space at both the top and bottom positions. For purposes of this example, assume the die size is about 0.130 mm$^2$, and the wafer is a 12 inch wafer, although the techniques provided herein can be applied to any wafer size and regardless of the size of the die being formed.

As can be seen in FIG. 1b, by shifting the various field columns up or down, in accordance with one example embodiment of the present invention, a significant number of the same die can be added to the same size wafer. Each of the columns that gained a field is generally designated with a +1 at the top of the column. In more detail, the resulting layout provides 120 FPW (an increase of 4 fields, or 3.45%), and 234 DPW (an increase of 6 die, or 2.6%). Conventional lithography tools can be used to print in such an offset pattern. Note that these increases are achieved, despite an increase in partial die (from 4 to 6) which are typically discarded. Further note that the wasted space at both the top and bottom positions of the wafer is significantly reduced. Further note that in other embodiments, the rows can be shifted (to the left or right).

Thus, in this example case, the field layout improvement for a 12 inch wafer allows for an increase in DPW of about 2.6%, when applying optimization on the Y-axis only. In other embodiments, the optimization can be applied in the X-axis, depending on factors such as wafer size and die size, as will be appreciated in light of this disclosure. Both the die size as well as the field size can generally remain constant throughout the grid. Note that a field can be one or more die.

Although not specifically shown in FIG. 1b, a registration marking scheme (which includes intermediate registration markers between field corners) for an offset grid can be used along the X-axis or Y-axis of the field when the registration pattern is created. In general, a registration pattern can be formed when individual neighboring fields come together when printed in an offset coordinate system to create one complete registration mark. The registration marking scheme with intermediate markers will be discussed in further detail with respect to FIGS. 2a-b, 3, and 4a-b.

The wafer can be implemented, for example, with any number of suitable semiconductor materials, such as silicon, germanium, or III-V materials. The substrate may be in bulk form, or in a semiconductor on insulator configuration such as silicon on insulator (SOI), or silicon germanium on insulator (SiGeOI). The top surface of the substrate may be strained or not. Any number of suitable wafer configurations can be used here, depending of factors such as the devices being formed and the desired material systems, as will be appreciated in light of this disclosure.

Registration Marking

Figure 2A:
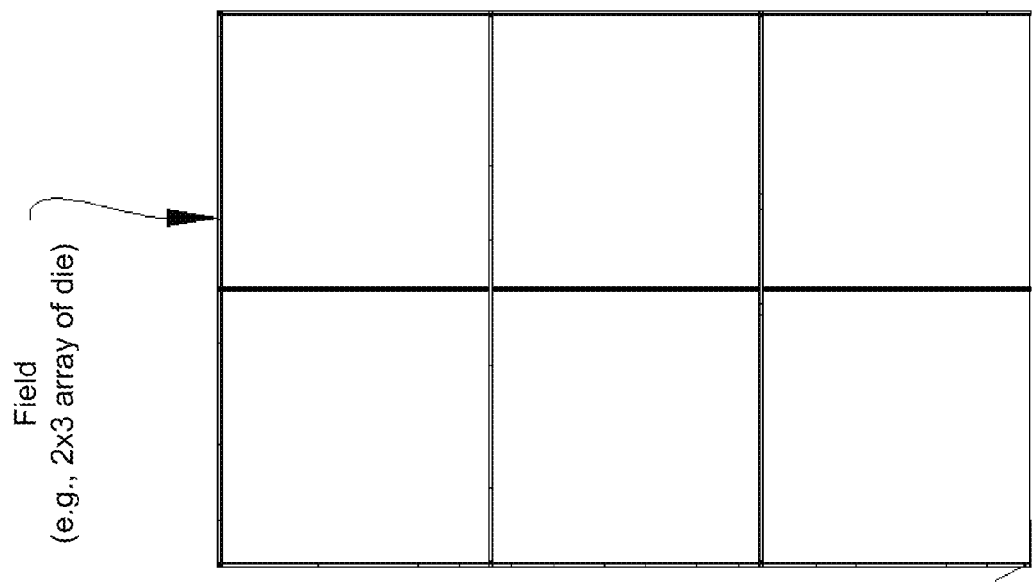
FIG. 2a illustrates a corner registration mark.
Figure 2A:
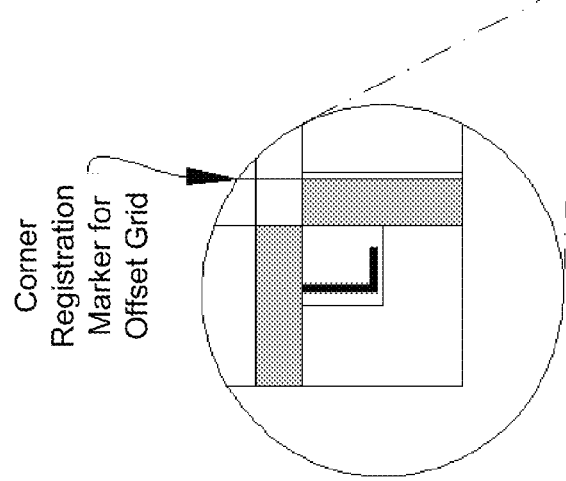

FIG. 2a illustrates an example device field that is a 2 die by 3 die array, and a conventional field development having registration marks at each corner of the fields.

The registration marks themselves can be implemented using any number of suitable symbols, shapes and configurations, ranging from simple to complex designs. For instance, in one embodiment, a simple registration mark can be implemented as an 'X' or '+' or '^' or '→' or 'O' or '--' or any other mark or combination of such marks suitable for aligning two of more items (in this case, offset fields). In another embodiment, a complex registration mark can be implemented with a combinational pattern having major and minor features that can overlay with similar features of other marks to facilitate a highly precise alignment, which may or may not be necessary, depending on factors such as the scale of the die and scribe line width, and dicing tool. In one such case, the complex registration mark may include smaller shapes (e.g., circles) and/or a code (e.g., alpha/numeric) within a larger shape (e.g., square), such that when aligned with other such complex registration marks, the code of each individual mark is visible so as to show the neighboring registration marks making up the overall registration pattern. As will be appreciated in light of this disclosure, embodiments of the present invention may be implemented with any type of registration mark.

Figure 2B:
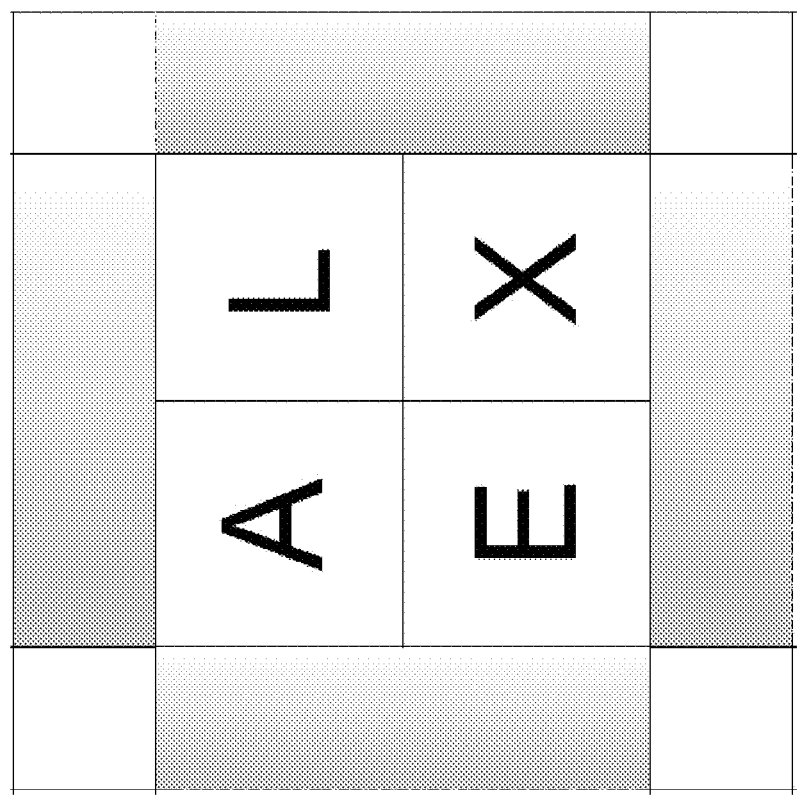
FIG. 2b illustrates a registration pattern formed by four corner registration marks coming together.

In this particular example shown in FIG. 2a, the registration mark for the bottom left corner of the field is shown (generally designated with the letter A). FIG. 2b shows how these conventional registration marks look when all four corresponding corners of four individual neighboring fields (generally designated with letters A, L, E, and X, respectively) come together when printed in a standard Cartesian coordinate system to create one complete registration mark. Note that each die can be configured with any desired componentry, and may be fabricated using any number of suitable semiconductor processes.

Figure 3:
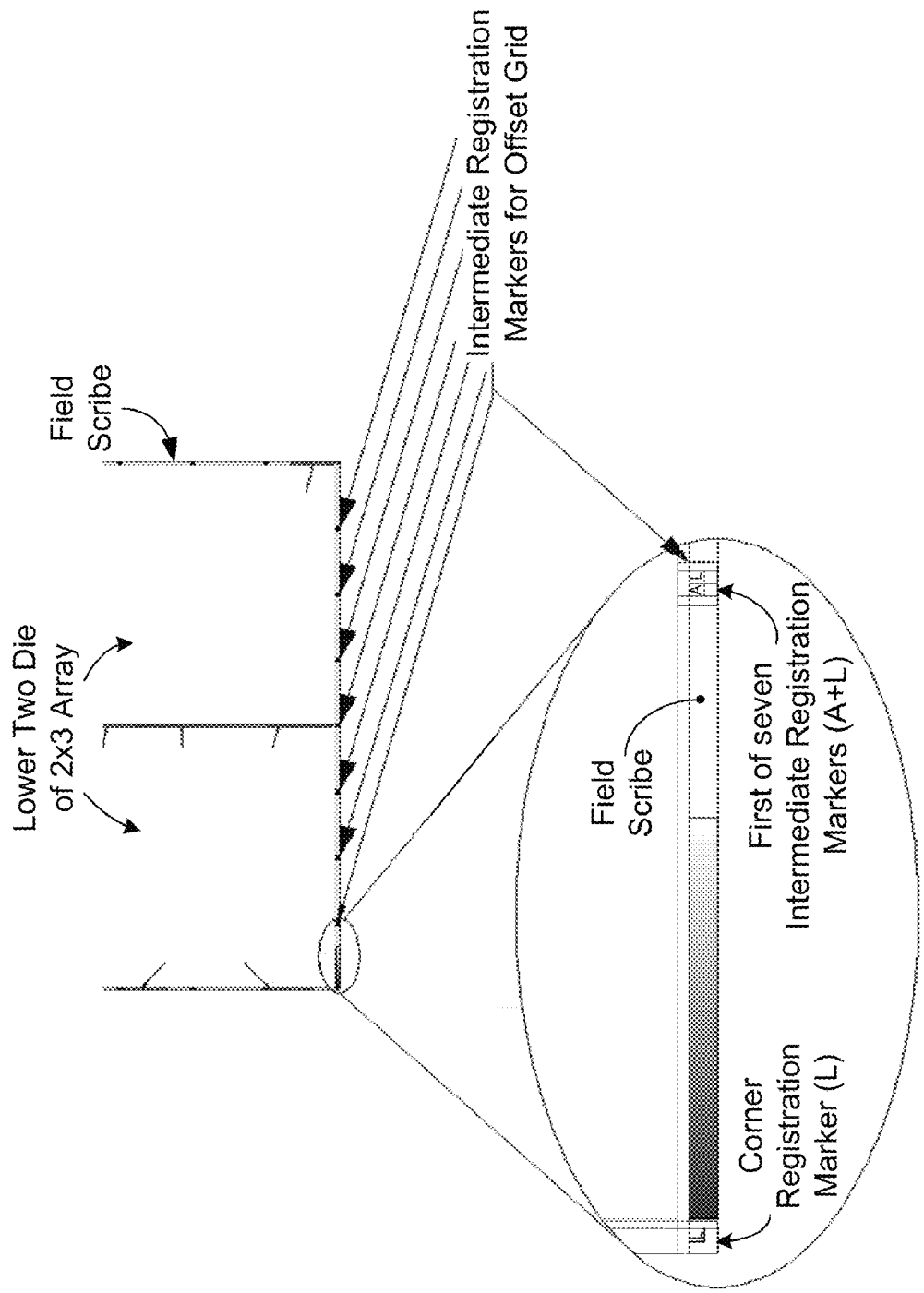
FIG. 3 illustrates an example device field configured with both corner and intermediate registration marks, in accordance with an embodiment of the present invention.

FIG. 3 illustrates the example device field of FIGS. 2a-b, but in an offset grid in accordance with an embodiment of the present invention. Only the bottom two die of the 2 die by 3 die array are shown. The configuration of each die is not shown, but can be implemented with any desired componentry/materials using various suitable semiconductor processes, as previously explained. In this example case, the offset grid optimization is done on the X-axis, in accordance with an embodiment of the present invention. As can be seen in this example embodiment, in addition to the original corner registration mark L, a total of seven intermediate registration marks are repeated along the X-axis of the field scribe, with the registration marks being equidistance from one another to facilitate interlocking the fields together during patterning. In this example, the intermediate registration marks include portions A and L, which can mate with parts E and X of the underlying row. Recall, however, that other embodiments may use a simple registration mark at each intermediate point, such as a line (or series of lines) or a symbol (e.g., '+' or 'x'). In addition, other embodiments may have fewer (e.g., 2 to 6) or more registration marks (e.g., 8 to 14), so long as they are equidistance from one another, as will be appreciated in light of this disclosure.

In general, the number of registration marks will generally depend on factors such as the length of the field and the desired number of opportunities to match up or align with one of the registration marks of a neighboring but offset field along the same X-axis. In the embodiment shown, each field includes the corner registration mark and then three intermediate registration marks, with all four spaced equidistance from one another. In another embodiment, there may be two to three registration marks per field side, including any original registration mark in a corner of the field. Alternatively, the frequency at which the registration marks are repeated can be set with as high as possible (limited only by available space for printing the registration marks one after the other). In any such cases, note that once one pair of neighboring registration marks is aligned, the remaining registration mark pairs will align in that row or column, given the equidistant spacing.

Thus, the field can be configured with any suitable type and/or number of registration marks. Because the registration marks are provided in an equidistant fashion, as the field rows or columns are shifted in the X or Y axis, alignment of registration marks between neighboring fields along those axes can be readily achieved. As such, the multiple registration marks along the X-axis for a lower row (for instance) can be readily aligned to the corresponding marks in the neighboring upper row. Similarly, the multiple registration marks along the Y-axis for a left column (for instance) can be readily aligned to the corresponding marks in the neighboring right column. Note that other field features (e.g., specific metrology/inspection/probing locations) can be moved and/or resized, if necessary, to allow for the insertion of the intermediate registration marks.

FIGS. 4a and 4b illustrate example neighboring top and bottom fields that are offset from one another but aligned using multiple registration marks, in accordance with an embodiment of the present invention. Assume that the fields are 2 by 3 arrays as shown in FIG. 2a, but any field configuration can be used, as will be appreciated in light of this disclosure. In this example case, the fields are offset from one another by two registration marks.

As can be further seen, there are a total of eleven registration marks shown in this example configuration, although not all are engaged between the two fields. The top field row is offset (relative to the bottom field row) to the right along the X-axis by two registration marks. Thus, the left corner registration mark and first intermediate registration mark at the top of the bottom field are not directly involved in the alignment of these two particular fields. The left corner registration mark at the bottom of the top field aligns with the second intermediate registration mark (Intermediate #2) at the top of the bottom field. Given the equidistant spacing between the registration marks, the next six registration marks along the X-axis for each field automatically align. Given the offset between the two fields, the right corner registration mark and seventh intermediate registration mark at the bottom of the top field are not directly involved in the alignment of these two particular fields. Table 1 summarizes the alignment of registration marks. Note that the x's denote registration marks not participating in the alignment of these two fields.

TABLE 1

Alignment of Registration Marks

| Registration Marks for Bottom Field | Registration Marks for Top Field |
| --- | --- |
| Left Corner | x |
| Intermediate #1 | x |
| Intermediate #2 | Left Corner |
| Intermediate #3 | Intermediate #1 |
| Intermediate #4 | Intermediate #2 |
| Intermediate #5 | Intermediate #3 |
| Intermediate #6 | Intermediate #4 |
| Intermediate #7 | Intermediate #5 |
| Right Corner | Intermediate #6 |
| x | Intermediate #7 |
| x | Right Corner |

As previously explained, and shown in the example embodiments of FIGS. 3 and 4a-b, the intermediate registration marks can be added into the scribe line defining each field (or other suitable location). Note that it is only necessary to add the intermediate registration marks to the X-rows if only optimizing in the X-axis, or to the Y-columns if only optimizing in the Y-axis.

Singulation of Offset Grid

Once a wafer having an offset field grid as described herein is fully printed, the individual die can be liberated through any number of suitable singulation processes. As previously explained, typical singulation processes include scribing and breaking, dicing or wire saws, or laser cutting. In accordance with various embodiments of the present invention, any of these processes or a combination thereof can be used as typically done, but with further consideration given to the offset nature of the grid. For instance, and in accordance with one particular example embodiment, a method is provided for singulating the die from a non-Cartesian grid. The method is depicted in FIGS. 5a through 5f, each of which will be discussed in turn.

Figures 5A, 5B:
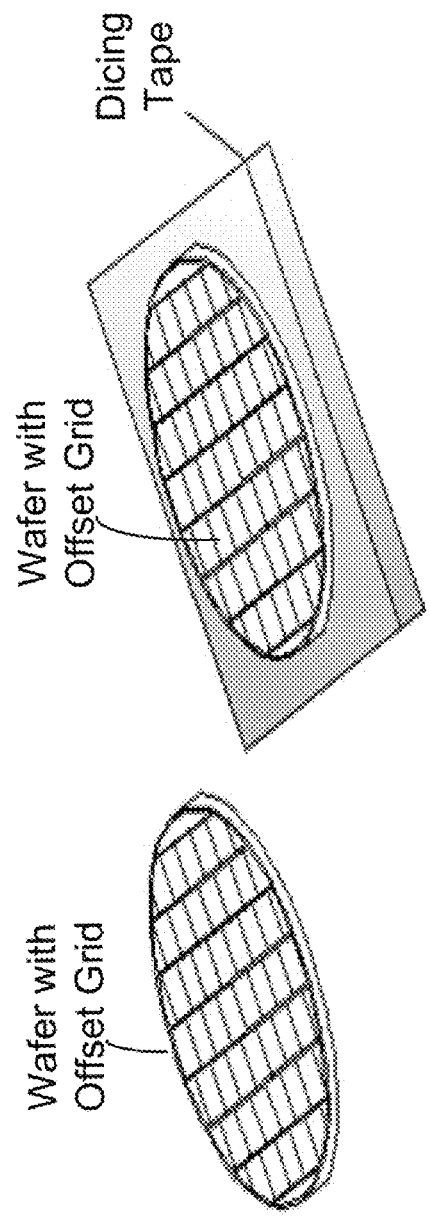
FIGS. 5a through 5f illustrate a method for singulating die from a non-Cartesian grid, in accordance with an embodiment of the present invention.

As can be seen, the method includes receiving a printed wafer (e.g., from a fab), the wafer having an offset field grid as described herein, and as shown in FIG. 5a. The wafer can be any size wafer and have a plurality of identical die formed thereon. The wafer is then adhered to dicing tape, just as conventionally done for standard Cartesian grid wafers, and as shown in FIG. 5b.

Standard laser scribing techniques can be used to scribe a straight line of a Cartesian grid, where no turns are required internal to the wafer. However, with an offset grid as described herein, there will generally be at least one turn (e.g., 90° turns) in the scribe lines in the X or Y axes. Thus, the laser scribing can be modified to accommodate such turns, so as to avoid overshoot past a turning point and/or over lasing in any one spot/area on the wafer (such as when slowing to make a turn).

Figure 5C:
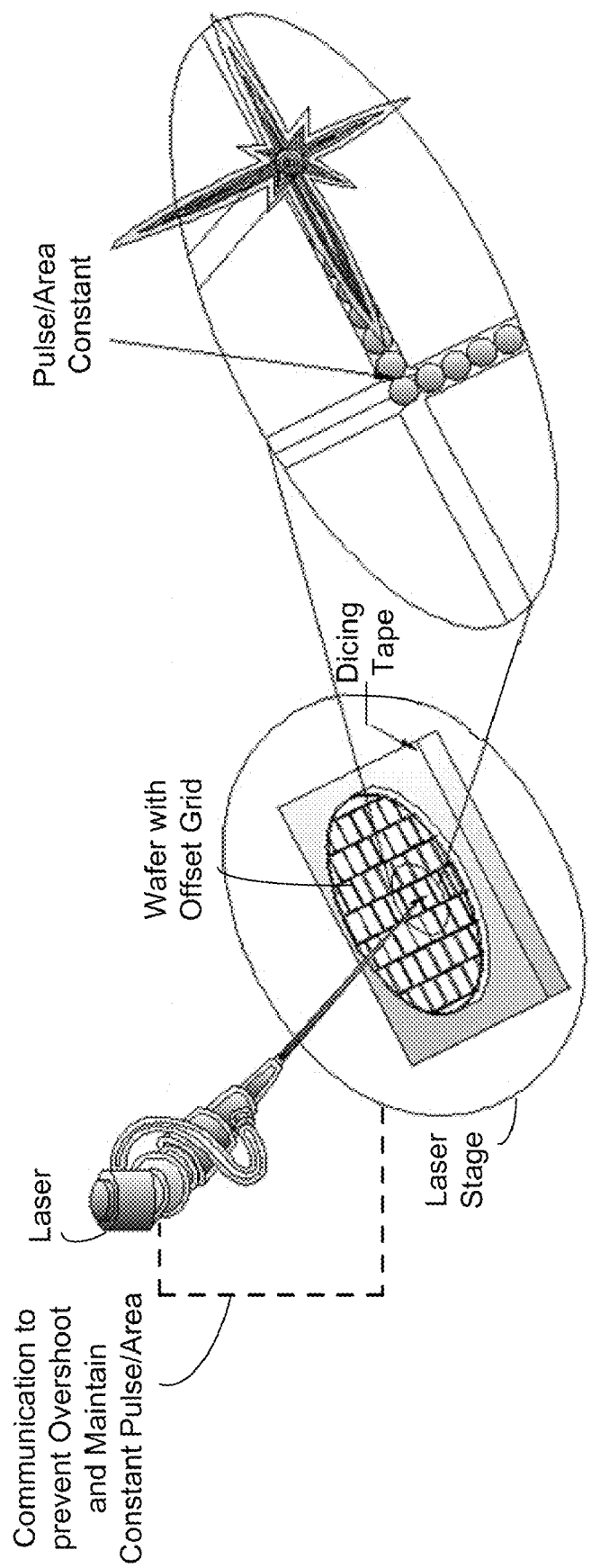

In more detail, when making a 90-degree turn cut, the speed of the laser stage generally changes when making a turn (e.g., the stage decelerated, comes to a stop, shifts direction, and accelerates in the new direction). In order to address both issues, the laser and stage system can effectively communicate with each other while maintaining a consistent pulse per unit area of wafer (particularly around turns). As can be seen in FIG. 5c, the laser and laser stage are communicate with one another to maintain a constant pulse per unit area when the stage slows to make a turn. For purposes of tolerance, the pulse per unit area may vary slightly as the turn is made (e.g., +/−20%, or less). Although not previously used in the semiconductor industry, conventional laser systems offer such functionality, and can be readily configured to execute same.

Figure 5D:
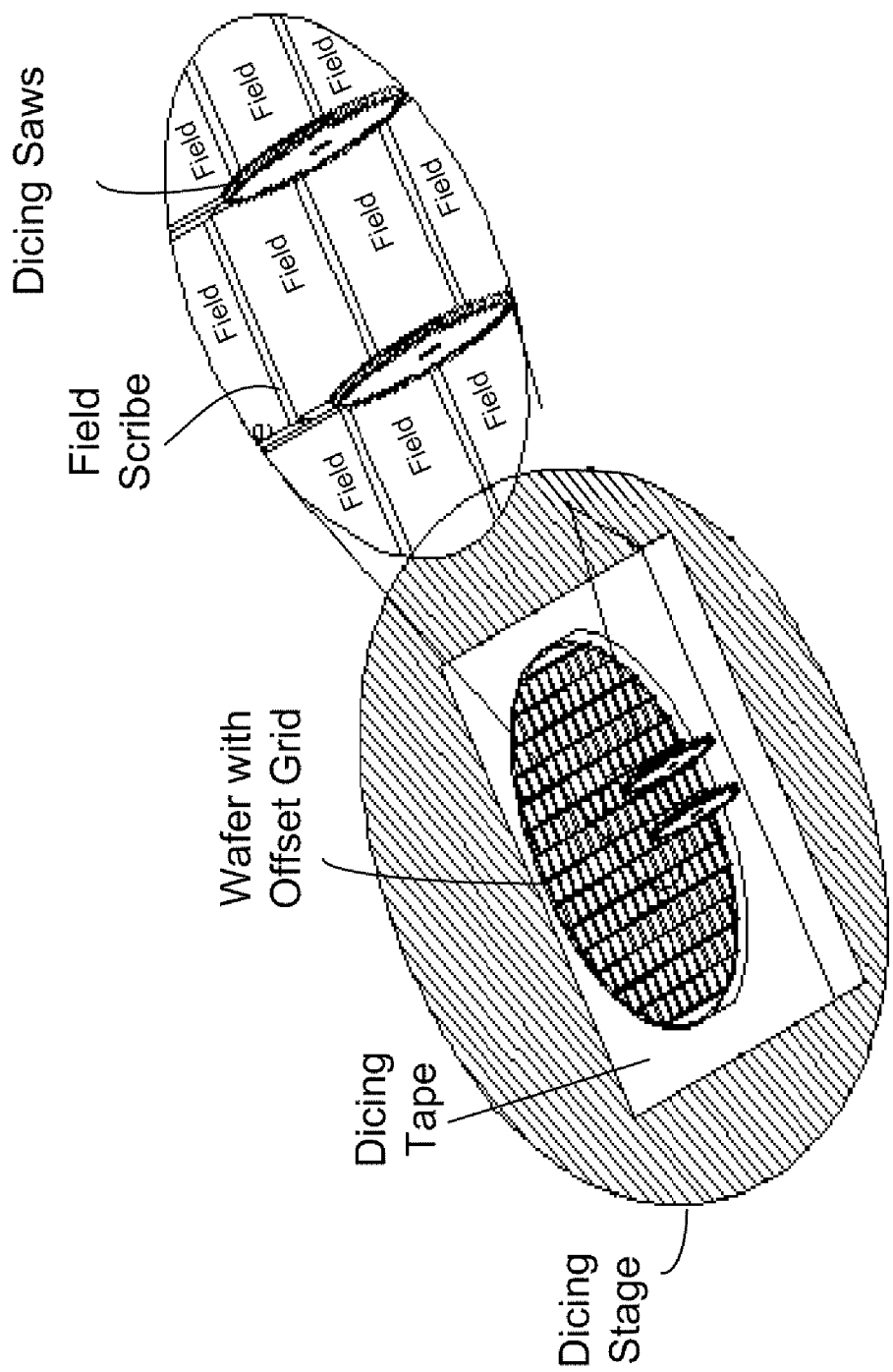

Once the wafer with the offset grid is laser scribed, a dicing tool can be used to dice the individual the wafer into individual die. In particular, and as shown in FIG. 5d, a dicing saw can be used to cut along the scribe line for each row (assuming optimization was provided along the X-axis), thereby liberating each row. Once the row is released, then the individual die can subsequently be diced from that row by making cuts perpendicular to the previously cut row scribe line. However, these perpendicular cuts are not made at this time. Rather, all rows are diced, and then the rows are realigned to effectively eliminate the offset between them, thereby allowing the perpendicular cut to be made through all the rows. This subsequent alignment and dicing is discussed with reference to FIGS. 5e and 5f. As will be appreciated, if optimization was provided along the Y-axis, then the initial dicing would be along the column scribe lines to liberate whole columns of die. Just as with the rows, once the columns are released, then they can be aligned to eliminate the offset so that the individual die can be diced from those columns by making cuts perpendicular to the previously cut column scribe line. As conventionally done, the dicing saw cuts through the wafer and through a portion of the supporting dicing tape (e.g., one-quarter to one-half the tape thickness), to prevent the die from moving after initial cuts are made and from falling as they are fully singulated.

Figure 5E:
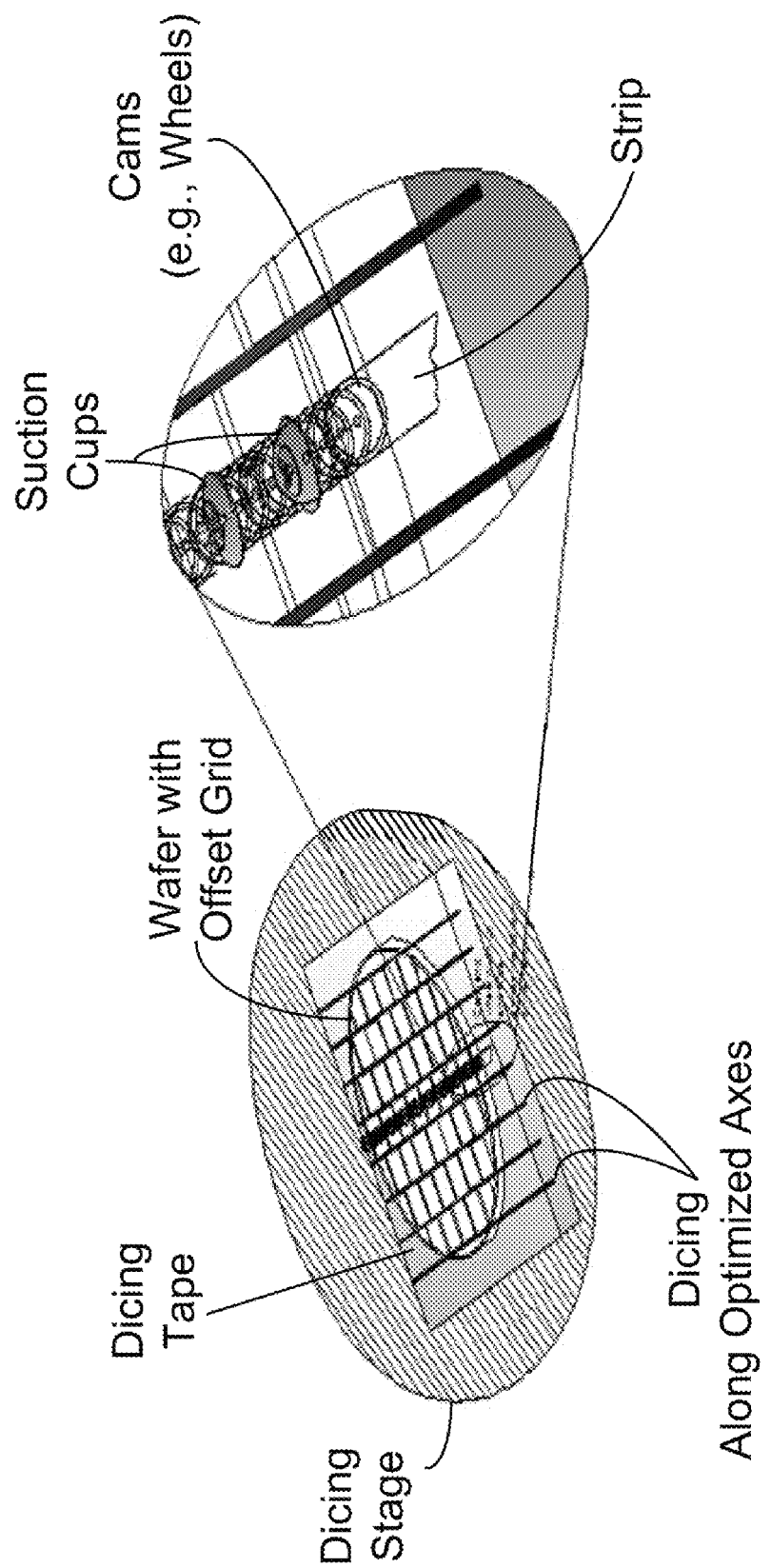

Once dicing operations are completed in the optimized axis, the strips of die diced along the optimized axis can be temporarily lifted off of the dicing tape and then put back down on the dicing tape, but in alignment with its neighboring strip. As this process is repeated for each strip, the offset grid is effectively converted to a Cartesian grid, thereby facilitating the second cut to complete the singulation process. Conventionally, once dicing operations are completed, each die is picked individually off of the dicing tape by a suction cup and cam arrangement, where the cam pushes each die sequentially up from the bottom of the dicing tape into the suction cup. In accordance with one example embodiment of the present invention, the lifting off is accomplished utilizing a series of suction cups configured for lifting the strip as a group of cams simultaneously push upwards from the bottom of the strip. The cams can be implemented, for example, with a series of wheels that gently glide across the bottom of the strip releasing the dicing tape from the given strip while reducing the tensile stress on the wafer strip being picked. The wheels could be implemented with a wear resistant material, such as Kevlar®. FIG. 5e illustrates one such example embodiment that could be used to lift off the strips from the dicing tape. Note that the cams (e.g., wheels) are shown for demonstration purposes, but would actually be underneath the strip being lifted off the dicing tape and therefore not visible.

Figure 5F:
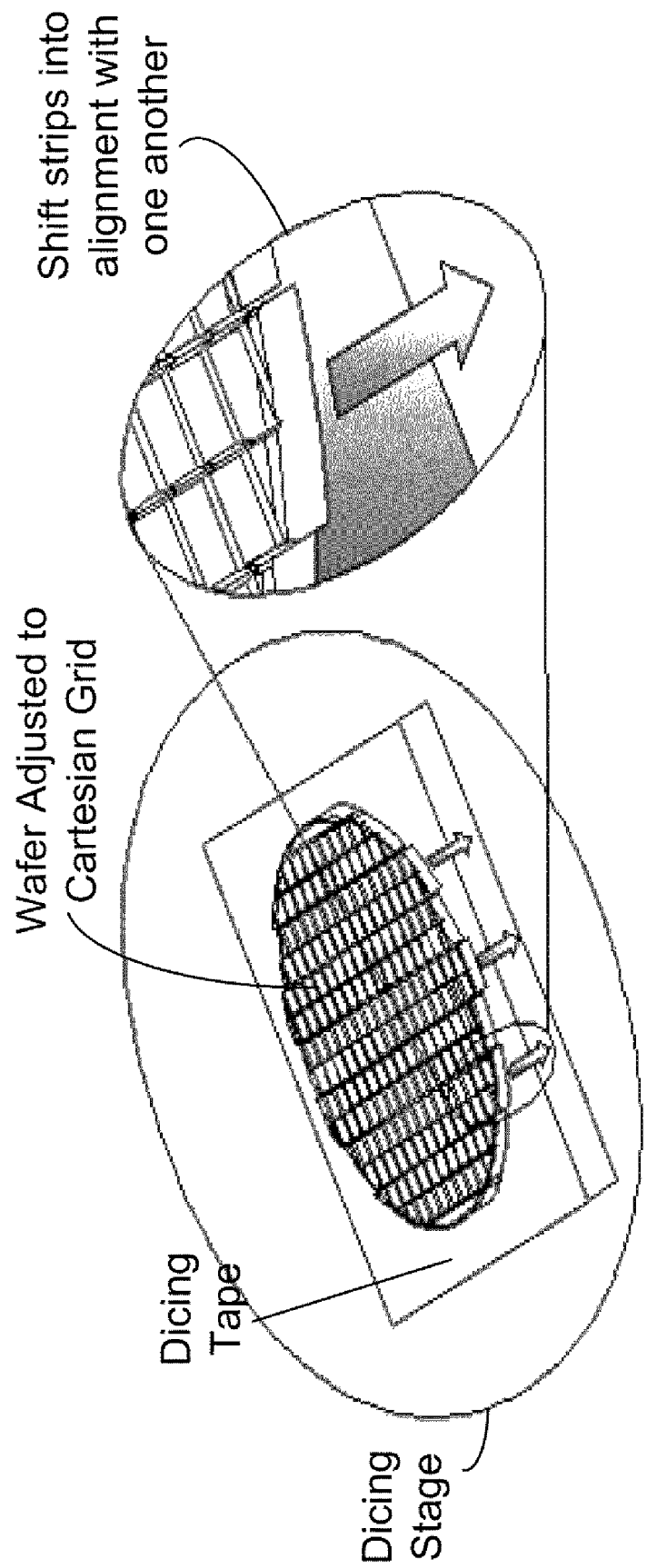

FIG. 5f demonstrates how the strips are moved into Cartesian format and placed back onto the dicing tape. In one embodiment, this alignment of the strips is carried out using an automated machine vision alignment system, such that the strips are re-aligned within the cutting specs of the dicing tool. Once alignment of the strip is completed, the remaining dicing procedure can be executed (as discussed with reference to FIG. 5d), so that each individual die is diced. The singulation process may further include picking up each liberated die, and positioning within individual die trays.

Numerous embodiments and configurations will be apparent in light of this disclosure. For instance, one example embodiment of the present invention provides a method, including receiving a wafer having a plurality of identical die formed thereon, the wafer having an offset grid of fields, each field made up of one or more dies. The method continues with adhering the wafer to dicing tape, and dicing the wafer into individual die. Dicing the wafer into individual die may include, for example, laser scribing the wafer to provide scribe lines for subsequent dicing. In one particular such case, laser scribing the wafer to provide scribe lines is accomplished while maintaining a consistent laser pulse per unit area of the wafer, the laser pulse per unit area of the wafer varying 20% or less. Dicing the wafer into individual die may further include dicing along scribe lines in one of the X or Y axes, so as to cut through the wafer and partially into the dicing tape, thereby making a plurality of wafer strips. Dicing the wafer into individual die may further include temporarily lifting a wafer strip off of the dicing tape and placing it back down on the dicing tape, but in alignment with its neighboring strip, and repeating the temporarily lifting and placing until the offset grid of fields is effectively converted to a Cartesian grid. Dicing the wafer into individual die may further include dicing along scribe lines in the other one of the X or Y axes, so as to cut through the wafer and partially into the dicing tape, thereby making a plurality of singulated die.

Another example embodiment of the present disclosure provides a semiconductor wafer. The wafer includes a non-Cartesian grid of rows and columns of fields, wherein either a plurality of the rows are offset from one another or a plurality of the columns are offset from one another. The wafer further includes a plurality of identical die formed on the wafer, each field including one or more of the die. The wafer may include, for example, a field scribe about each field, with at least one side of each field scribe including both corner registration marks and intermediate registration marks between the corner registration marks, wherein a sub-set of the corner and intermediate registration marks of one field align with a sub-set of the corner and intermediate registration marks of another neighboring field. In some cases, the wafer only has one die type formed thereon. In some cases, the wafer has a greater number of fields relative to a second wafer identical to the wafer in wafer size and field size, but having a Cartesian grid of rows and columns of fields. In one specific particular case, a plurality of the rows are offset from one another. In another specific particular case, a plurality of the columns are offset from one another. The field size may be constant throughout the grid. The wafer can be, for example, a bulk wafer, or a semiconductor on insulator configuration.

Another example embodiment of the present disclosure provides a semiconductor wafer. In this example, the wafer includes a non-Cartesian grid of rows and columns of fields, wherein either a plurality of the rows are offset from one another or a plurality of the columns are offset from one another, and field size is constant throughout the grid. The wafer further includes a field scribe about each field, with at least one side of each field scribe including both corner registration marks and intermediate registration marks between the corner registration marks, wherein a sub-set of the corner and intermediate registration marks of one field align with a sub-set of the corner and intermediate registration marks of another neighboring field. The wafer further includes a plurality of identical die formed on the wafer, each field including one or more of the die, wherein the wafer only has one die type formed thereon. The wafer has a greater number of fields relative to a second wafer identical to the wafer in wafer size and field size, but having a Cartesian grid of rows and columns of fields. In one specific particular case, a plurality of the rows are offset from one another. In another specific particular case, a plurality of the columns are offset from one another. The field size may be constant throughout the grid, and the wafer can be, for example, a bulk wafer (e.g., silicon), or a semiconductor on insulator configuration (e.g., silicon on insulator, or SOI).

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A method, comprising:
   receiving a wafer having a plurality of identical die formed thereon, the wafer having an offset grid of fields, each field made up of one or more dies;
   adhering the wafer to dicing tape;
   laser scribing to provide scribe lines for subsequent dicing, wherein laser scribing the wafer to provide scribe lines is accomplished while maintaining a consistent laser pulse per unit area of the wafer, the laser pulse per unit area of the wafer varying 20% or less; and dicing the wafer into individual die.

2. A method, comprising:
receiving a wafer having a plurality of identical die formed thereon, the wafer having an offset grid of fields, each field made up of one or more dies;
adhering the wafer to dicing tape;
laser scribing to provide scribe lines for subsequent dicing;
dicing the wafer into individual die; wherein dicing the wafer into individual die comprises: dicing along scribe lines in one of the X or Y axes, so as to cut through the wafer and partially into the dicing tape, thereby making a plurality of wafer strips.

3. The method of claim 2 wherein dicing the wafer into individual die comprises:
temporarily lifting a wafer strip off of the dicing tape and placing it back down on the dicing tape, but in alignment with its neighboring strip;
repeating the temporarily lifting and placing until the offset grid of fields is effectively converted to a Cartesian grid.

4. The method of claim 3 wherein dicing the wafer into individual die comprises:
dicing along scribe lines in the other one of the X or Y axes, so as to cut through the wafer and partially into the dicing tape, thereby making a plurality of singulated die.

5. A semiconductor wafer, comprising:
a non-Cartesian grid of rows and columns of fields, wherein a plurality of the rows are offset from one another;
a plurality of identical die formed on the wafer, wherein the plurality of identical die comprise all of dies formed on the wafer, each field including one or more of the die; and
a field scribe about each field, with at least one side of each field scribe including both corner registration marks and intermediate registration marks between the corner registration marks, wherein a sub-set of the corner and intermediate registration marks of one field align with a sub-set of the corner and intermediate registration marks of another neighboring field.

6. The semiconductor wafer of claim 5 wherein the wafer only has one die type formed thereon.

7. The semiconductor wafer of claim 5 wherein the wafer has a greater number of fields relative to a second wafer identical to the wafer in wafer size and field size, but having a Cartesian grid of rows and columns of fields.

8. The semiconductor wafer of claim 5 wherein field size is constant throughout the grid.

9. The semiconductor wafer of claim 5 wherein wafer is a bulk wafer.

10. The semiconductor wafer of claim 5 wherein wafer is a semiconductor on insulator configuration.

11. A semiconductor wafer, comprising:
a non-Cartesian grid of rows and columns of fields, wherein either a plurality of the rows are offset from one another or a plurality of the columns are offset from one another, and field size is constant throughout the grid;
a field scribe about each field, with at least one side of each field scribe including both corner registration marks and intermediate registration marks between the corner registration marks, wherein a sub-set of the corner and intermediate registration marks of one field align with a sub-set of the corner and intermediate registration marks of another neighboring field; and
a plurality of identical die formed on the wafer, each field including one or more of the die, wherein the wafer only has one die type formed thereon;
wherein the wafer has a greater number of fields relative to a second wafer identical to the wafer in wafer size and field size, but having a Cartesian grid of rows and columns of fields.

12. The semiconductor wafer of claim 11 wherein a plurality of the rows are offset from one another.

13. The semiconductor wafer of claim 11 wherein a plurality of the columns are offset from one another.

14. The semiconductor wafer of claim 11 wherein wafer is a bulk wafer.

15. The semiconductor wafer of claim 11 wherein wafer is a semiconductor on insulator configuration.

16. A semiconductor wafer, comprising:
a non-Cartesian grid of rows and columns of fields, wherein a plurality of the columns are offset from one another; and
a plurality of identical die formed on the wafer, wherein the plurality of identical die comprise all of dies formed on the wafer, each field including one or more of the die; and
a field scribe about each field, with at least one side of each field scribe including both corner registration marks and intermediate registration marks between the corner registration marks, wherein a sub-set of the corner and intermediate registration marks of one field align with a sub-set of the corner and intermediate registration marks of another neighboring field.

17. The semiconductor wafer of claim 16 wherein the wafer only has one die type formed thereon.

18. The semiconductor wafer of claim 16 wherein the wafer has a greater number of fields relative to a second wafer identical to the wafer in wafer size and field size, but having a Cartesian grid of rows and columns of fields.

19. The semiconductor wafer of claim 16 wherein field size is constant throughout the grid.

20. The semiconductor wafer of claim 16 wherein wafer is a bulk wafer.

21. The semiconductor wafer of claim 16 wherein wafer is a semiconductor on insulator configuration.

* * * * *